(12) United States Patent
Koshikawa

(10) Patent No.: US 6,385,104 B2
(45) Date of Patent: May 7, 2002

(54) SEMICONDUCTOR MEMORY DEVICE HAVING A TEST MODE DECISION CIRCUIT

(75) Inventor: Yasuji Koshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/839,504

(22) Filed: Apr. 20, 2001

(30) Foreign Application Priority Data

Apr. 24, 2000 (JP) ........................................ 2000-122901

(51) Int. Cl.[7] ................................................ G11C 7/00
(52) U.S. Cl. .................... 365/201; 365/200; 365/230.06
(58) Field of Search .............................. 365/201, 200, 365/230.06, 194, 189.09

(56) References Cited

U.S. PATENT DOCUMENTS 6,201,747 B1 * 3/2001 Venkatesh et al. .......... 365/201

* cited by examiner

Primary Examiner—David Nelms
Assistant Examiner—David Lam
(74) Attorney, Agent, or Firm—Hutchins, Wheeler & Dittmar

(57) ABSTRACT

The semiconductor memory device according to the present invention comprises a memory cell array having a plurality of memory cells, a plurality of bit lines, a plurality of word lines, a row decoder which selects a prescribed word line in response to a row address and a control signal, a test mode decision circuit which generates a test signal by deciding that the device is in a test mode, a control signal generating circuit which brings the control signal to the activated state and keeps it there for a prescribed duration in response to an instruction signal, wherein the control signal generating circuit has a means for setting the change of the control signal to the inactivated state in response to the occurrence of the test signal sooner than in the normal operation.

4 Claims, 8 Drawing Sheets

SEMICONDUCTOR MEMORY DEVICE HAVING A TEST MODE DECISION CIRCUIT

BACKGROUND OF THE INVENTION

1. Field of the Invention

The present invention relates to a semiconductor memory device, and more particularly to a semiconductor memory device that has a function of detecting a defective memory cell or the like which lacks a capability to cope with the requirement for a write recovery time, in connection with the process of performing a screening test.

2. Description of the Prior Art

FIG. 5 is a block diagram showing the configuration of a conventional semiconductor memory device. In FIG. 5, an internal clock generating circuit 1 is a circuit which generates a synchronizing internal clock based on an input external clock CLK, a command decoder 2 is a decoder which decodes a command based on data input to input terminals /RAS, /CAS, /WE and /CS, and an internal address generating circuit 3 is a circuit which generates an internal address for row address and column address of a memory cell array 4 based on address data input to an ADD terminal. The memory cell array 4 has a plurality of memory cells arranged in a matrix form.

Moreover, a row system control signal generating circuit 5 is a control circuit that controls the selection of a word line of the memory cell array 4. In the row system control signal generating circuit 5 there is formed a circuit consisting of a delay circuit 6a, a NAND circuit 6b and an inverter circuit 6c, as shown in FIG. 6. This circuit sets the selection timing of a word line and the nonselection timing of a word line. A row decoder 6 is a circuit that decodes the row address of the memory cell array 4, and a column decoder 7 is a circuit that decodes the column address of the memory cell array 4.

A sense amplifier circuit 8 is an amplifier circuit which amplifies a signal read from the memory cell array 4, a data amplifier circuit 9 is an amplifier circuit which further amplifies the output signal of the sense amplifier circuit 8 to the CMOS level, and a column system circuit 10 is a control circuit which controls a column selection line. The column system circuit 10 controls the decision as to the rise and fall timings, or the like of the column selection line of the column decoder 7. An input and output circuit 11 is a circuit which controls data input to and data output from a terminal DQ.

Next, referring to the timing chart in FIG. 7, the operation of the conventional device in FIG. 5 will be described. FIG. 7(a) and FIG. 7(b) show an external clock CLK and a command decoded by the command decoder 2, respectively. First, assume that data RASB, CASB, WEB and CSB input to the input terminals of the command decoder 2 at the rise of cycle C1 of the clock CLK are decoded to be an active command as shown in FIG. 7(b). An active command is a command that selects the word line corresponding to a row address input from the outside.

When the device goes to the active command state, a signal RAS2B output from the command decoder 2 to the row system control signal generating circuit 5 falls to a low level as shown in FIG. 7(c). Subsequently to that, a signal RAS3B output from the row system control signal generating circuit 5 to the column decoder 6 falls to a low level as shown in FIG. 7(d). In the meantime, in the internal address generating circuit 3, a row address is generated based on the data input when the device was at the active command, and the address is supplied to the row decoder 6.

In the row decoder 6, the word line corresponding to the input row address is brought to a high level as shown in FIG. 7(e) to select the word line corresponding to the row address. When the word line is selected, data in the memory cell 4 connected to the word line are read at the sense amplifier circuit 8 via a bit line pair as shown in FIG. 7(f), and the data are amplified by the sense amplifier circuit 8.

Then, if it is assumed that the result of decoding of the input data at the rise of cycle C2 of the external clock CLK is a write command as shown in FIG. 7(a), a column selection line 1, corresponding to the column address input then from the internal address generating circuit 3 to the column decoder 7, is selected as shown in FIG. 7(g), and the column selection line 1 is kept at the high level for a prescribed duration. With the selection of the column selection line 1, data input to the DQ terminal at the input of the write command are supplied to the sense amplifier circuit 8 via the input and output circuit 11 and the data amplifier circuit 9 to be written to the sense amplifier in the sense amplifier circuit 8 selected by the column selection line 1. The written data (FIG. 7(f)) are supplied at the same time to the memory cell array 4 via the bit line pair to be written to the memory cell that has been selected by the word line.

Next, if it is assumed that the result of decoding of the input data at the rise of cycle C3 of the external clock CLK is a write command again as shown in FIG. 7(a), a column selection line 2 corresponding to a column address input then from the internal address generating circuit 3 is selected (at the high level) for a prescribed duration by the column decoder 7 as shown in FIG. 7(i). With the selection of the column selection line 2, data input to the DQ terminal at the input of the write command are supplied to the sense amplifier circuit 8 via the input and output circuit 11 and the data amplifier circuit 9 to be written to the sense amplifier selected by the column selection line 2 in the sense amplifier circuit 8.

The written data (FIG. 7(h)) are supplied at the same time to the memory cell array 4 through the bit line pair to be written to the memory cell that has been selected by the wordline. Here, the time during which the column selection lines 1 and 2 are kept at the high level, namely, the write time to the sense amplifier circuit 8 is set in advance.

Next, if it is assumed that the result of decoding of the input data at the rise of cycle C4 of the external clock CLK is a precharge command as shown in FIG. 7(a), the signal RAS2B of the command decoder 2 rises to the high level as shown in FIG. 7(c). Subsequently to that, the signal RAS3B from the row system control signal generating circuit 5 rises to the high level as shown in FIG. 7(d), and in response to this the word line that has been selected goes to the unselected state (at the low level) as shown in FIG. 7(e). Here, in the semiconductor memory device in FIG. 5, the time during which the column selection line stays at the high level, namely, the write time to the sense amplifier circuit 8 is set in advance such that the level falls off after the lapse of a prescribed time from the time of its rise.

Besides the above, there has also been known a conventional device in which the high level duration of the column selection line, namely, the write time to the sense amplifier circuit 8, is set in synchronism with the external clock CLK. FIG. 8 is a timing chart showing the operation of such a semiconductor memory device. FIG. 8(a) to FIG. 8(i) correspond to FIG. 7(a) to FIG. 7(i), respectively. In this case, the only difference of FIG. 8 from FIG. 7 is the duration of the high level of the column selection lines shown in FIG. 8(g) and FIG. 8(i), and the rest is the same as in FIG. 7. In this conventional example, the high level duration of the column selection lines, namely, the write time to the sense amplifier circuit, agrees approximately with the cycle of the external clock CLK. In either of FIG. 7 and FIG. 8, the write time to the memory cell from the sense amplifier circuit to the memory cell via the bit line pair depends on the cycle time tCK of the clock.

Now, in the conventional semiconductor memory devices, there are some whose sense amplifier or memory cell needs longer write time than others due to defect of one kind or another, and such a defective sense amplifier and a defective memory cell are required to be rejected by a screening test prior to the shipping. Moreover, the minimum time from the input of a write command to the input of a precharge command is regulated by a specification called tDPL (write recovery time), and sense amplifiers and memory cells that fail to have a margin to tDPL are required to be rejected as defective products.

As a method of detecting a defective sense amplifier or a defective memory cell that lacks the capability to cope with the requirement for tDPL, one may consider, for example, a test in which the value of tDPL is made smaller than the standard value. Since, however, the cycle time (tCK) of the external clock will have to be reduced at the same time, it was not possible to discriminate which of tCK and tDPL was the true cause of the defect.

BRIEF SUMMARY OF THE INVENTION

Objects of the Invention

It is the object of the present invention to provide a semiconductor memory device that makes it possible to detect simply and accurately a defective sense amplifier or a defective memory cell generated due to the small value of tDPL.

Summary of the Invention

The semiconductor memory device according to the present invention comprises a memory cell array having a plurality of bit lines, a plurality of word lines provided perpendicular to the plurality of bit lines, and a plurality of memory cells disposed at the intersections of the word lines and the bit lines, a row decoder which selects a prescribed word line out of the plurality of word lines in response to a row address when the control signal is in an activated state and puts all the word lines to an unselected state when the control signal is in an inactivated state, a test mode decision circuit which decides a test mode and generates a test signal, and a control signal generating circuit which brings the control signal to the activated state for a prescribed duration in response to an instruction signal, where the control signal generating circuit has a means which, in response to the occurrence of a test signal, hastens the change of the control signal to the inactivated state sooner than in the normal operation.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
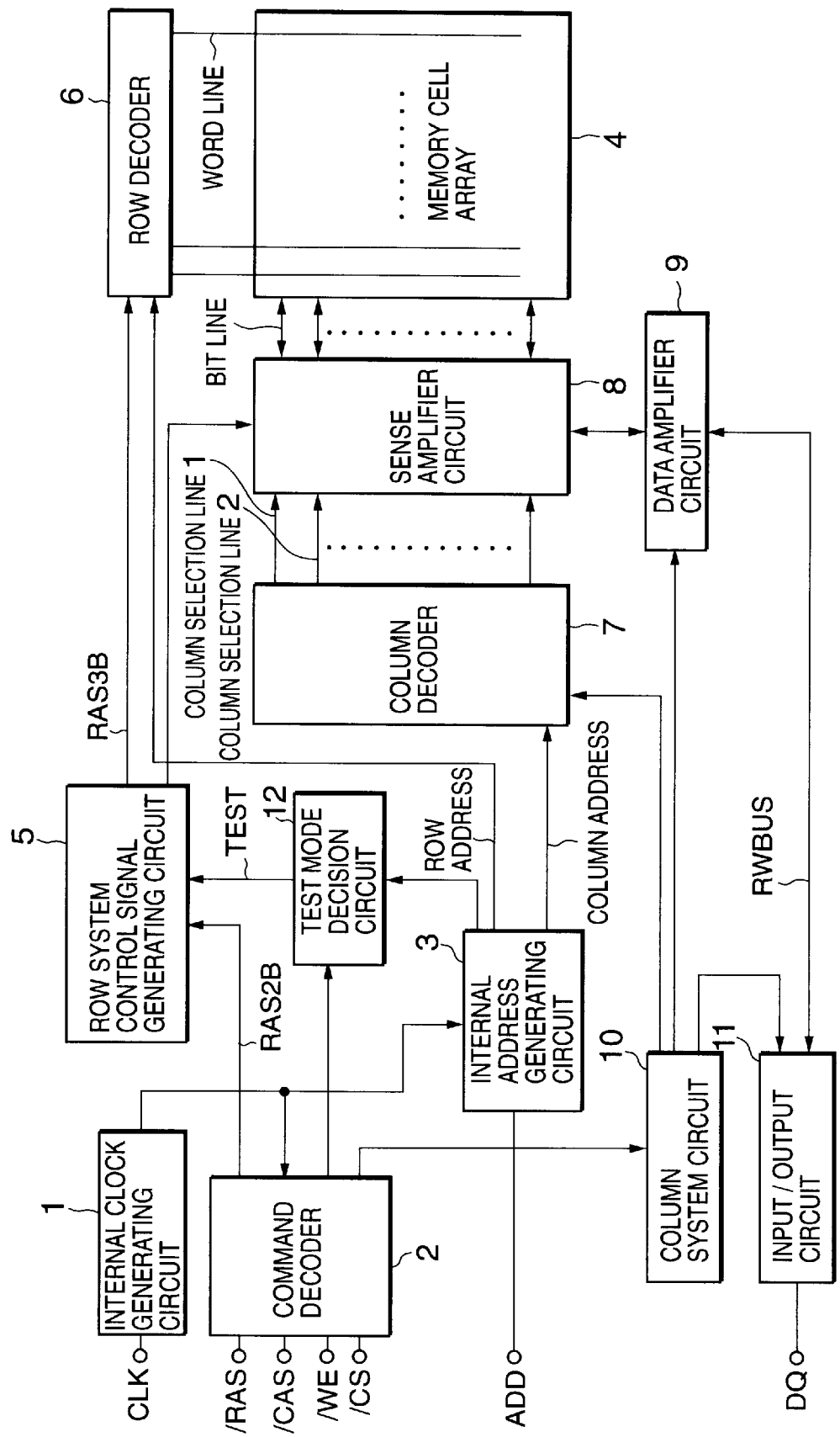
FIG. 1 is a block diagram showing the configuration of an example of semiconductor memory device according to this invention.
Figure 5:
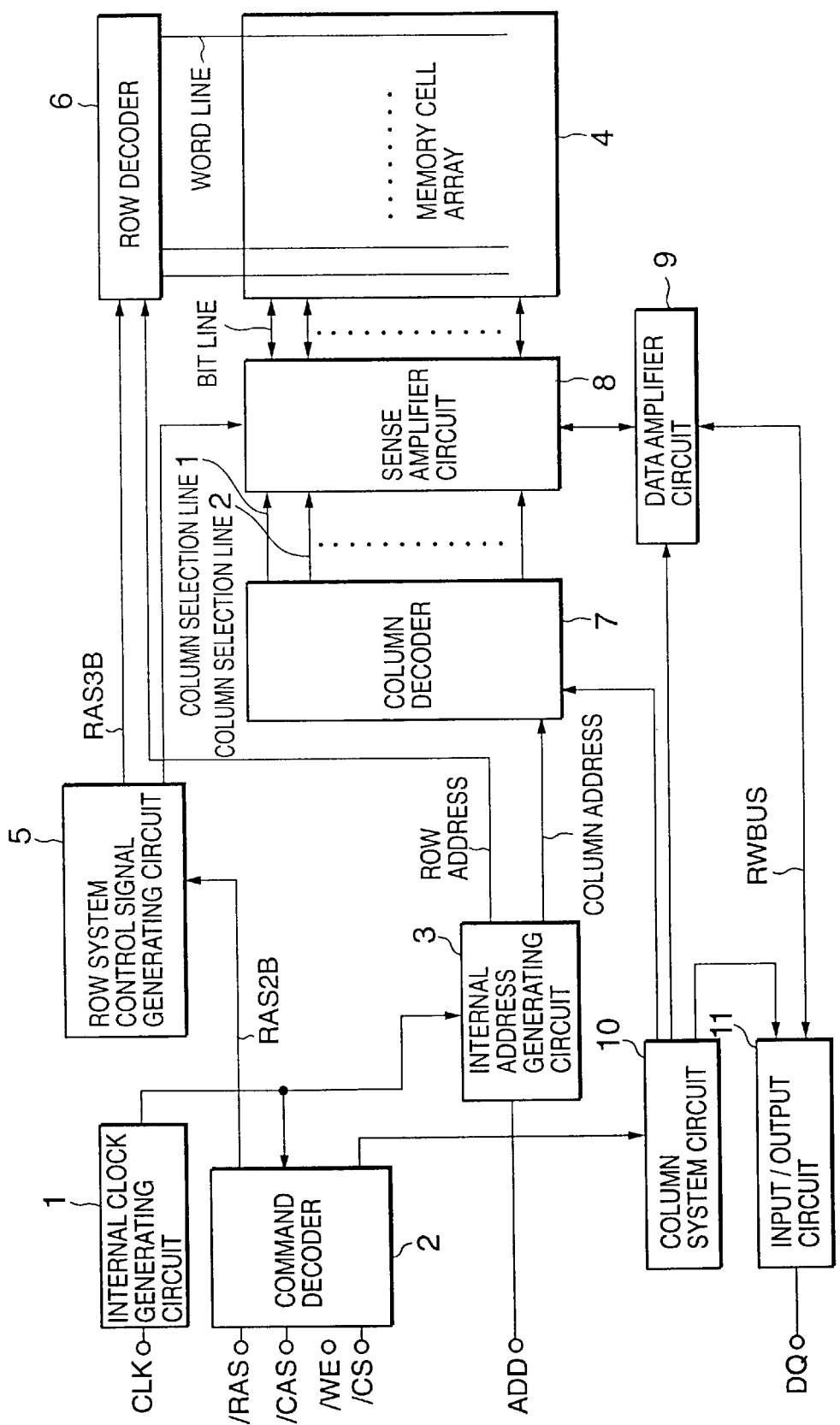
FIG. 5 is a block diagram showing the configuration of a conventional semiconductor memory device.

In the following, referring to the drawings, an embodiment of this invention will be described in detail. FIG. 1 is a block diagram showing the configuration of the embodiment of the semiconductor memory device according to the invention. In FIG. 1, components identical to those of the conventional device in FIG. 5 are given identical symbols to omit their description. Namely, an internal clock generating circuit 1, a command decoder 2, an internal address generating circuit 3, a memory cell array 4, a row system control signal generating circuit 5, a row decoder 6, a column decoder 7, a sense amplifier circuit 8, a data amplifier circuit 9, a column system circuit 10, and an input and output circuit 11 are respectively the same as those in the conventional device in FIG. 5.

Moreover, in this embodiment, there is installed a test mode decision circuit 12 which decides whether an operating mode is a normal mode or a test mode by receiving data from the command decoder 2 and the internal address generating circuit 3, and outputs a TEST signal that corresponds to the operating mode to the row system control signal generating circuit 5. The test mode decision circuit 12 is a means for deteriorating the overall write recovery time tDPL so as to make it readily possible to reject a defective sense amplifier or a defective memory cell that lacks the capability of coping with the requirement for tDPL, by assigning a word line to the unselected state at a timing sooner than in the normal mode when the operating mode is decided to be a test mode, as will be described in more detail later.

Figure 2:
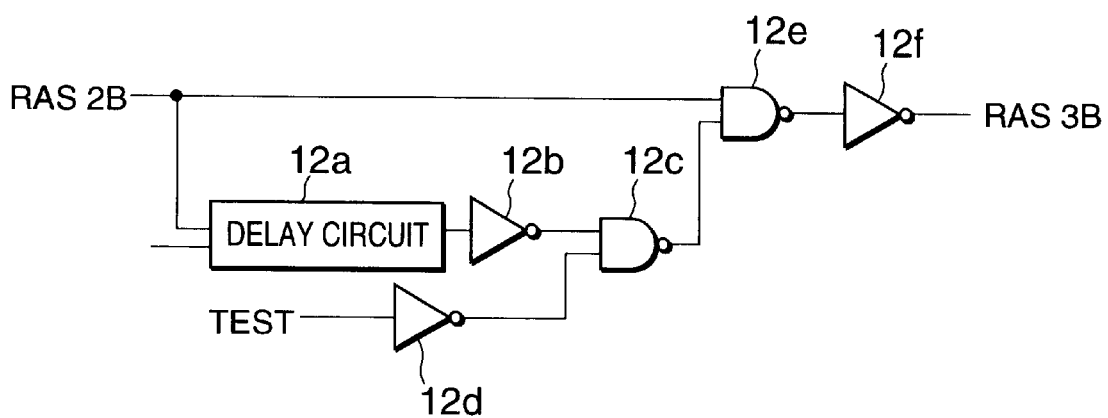
FIG. 2 is a circuit diagram showing a part of a row system control signal generating circuit in FIG. 1.
Figure 6:
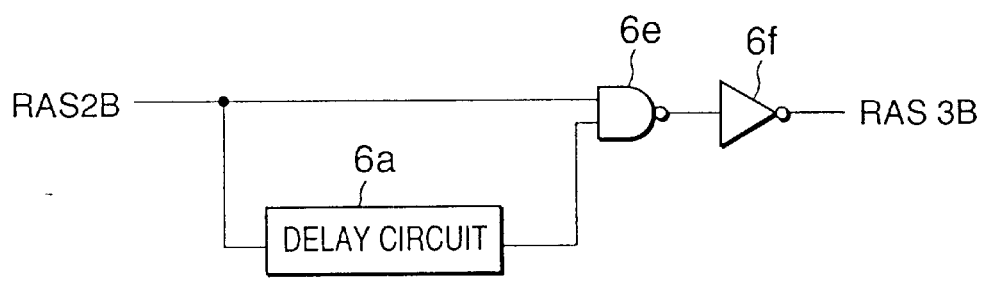
FIG. 6 is a circuit diagram showing a part of the row system control signal generating circuit in FIG. 5.

In the row system control signal generating circuit 5, the configuration is partly different from that of the conventional device in FIG. 5, namely, the circuit in FIG. 2 is employed instead of the circuit shown in FIG. 6. The circuit in FIG. 2 which is for setting the selection timing and the nonselection timing for the word line as mentioned above, is composed of a delay circuit 12a, inverter circuits 12b, 12d and 12f, and NAND circuits 12c and 12e in this embodiment.

The signal RAS2B is input to the delay circuit 12a and the NAND circuit 12e from the command decoder 2 and a TEST signal is input to the inverter circuit 12d from the test mode decision circuit 12, and the row system control signal generating circuit 5 outputs a signal RAS3B to the row decoder 6 in response to these signals. Here, the TEST signal from the test mode decision circuit 12 is at the low level in the normal mode and is at the high level in the test mode, where the operation in the normal mode is the same as in the conventional device.

In the meantime, in the test mode, since a high level TEST signal is supplied to the inverter circuit 12d from the test mode decision circuit 12, and the delay circuit 12a and the inverter circuit 12b are invalidated, the rise of the signal RAS3B occurs sooner relative to the rise of the signal RAS2B. In other words, in the test mode, the timing for placing the word line in the unselected state is hastened forcibly, and the write recovery time tDPL is made to be disadvantageous.

Figure 3:
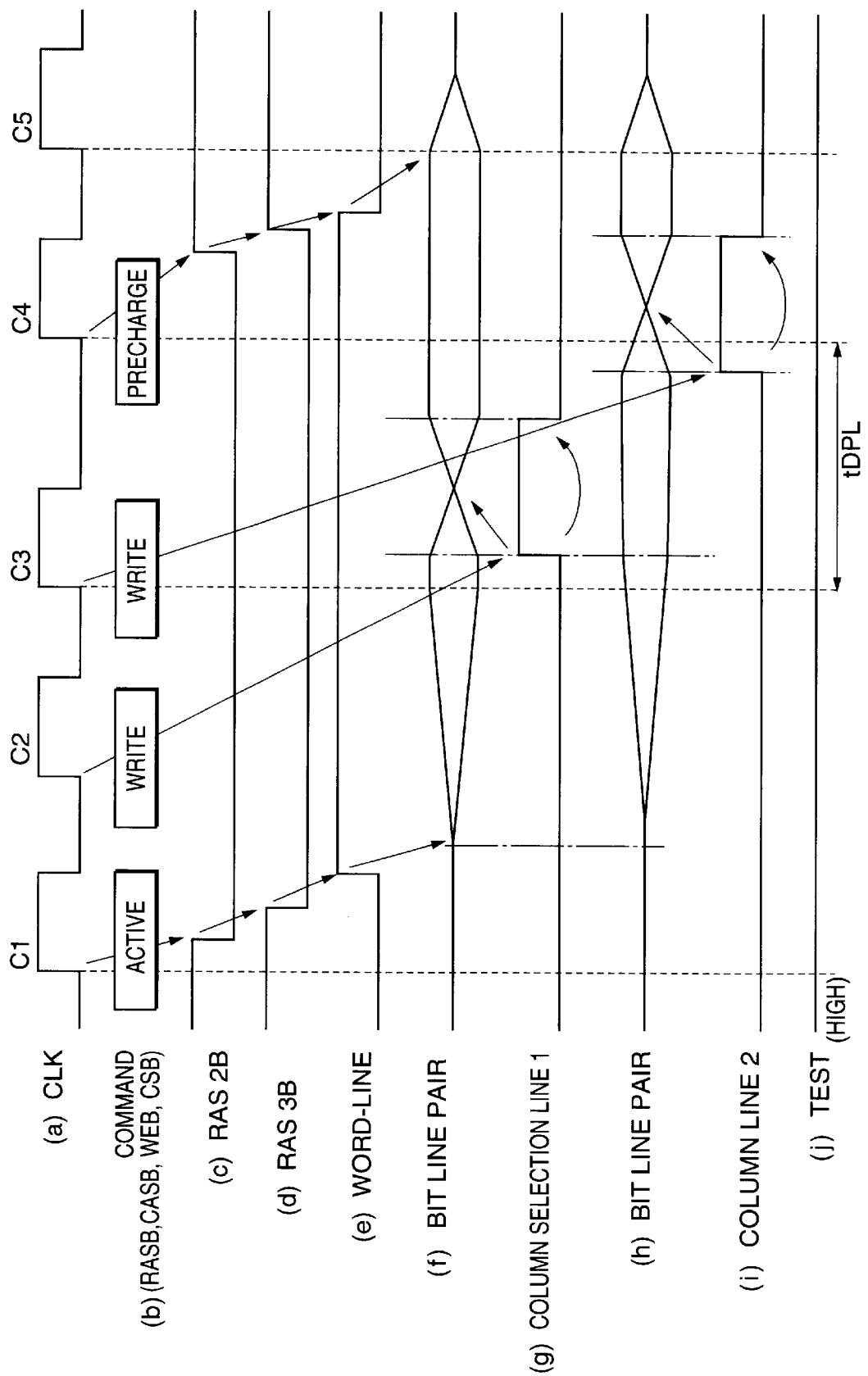
FIG. 3 is a timing chart showing the operation of the embodiment in FIG. 1.
Figure 7:
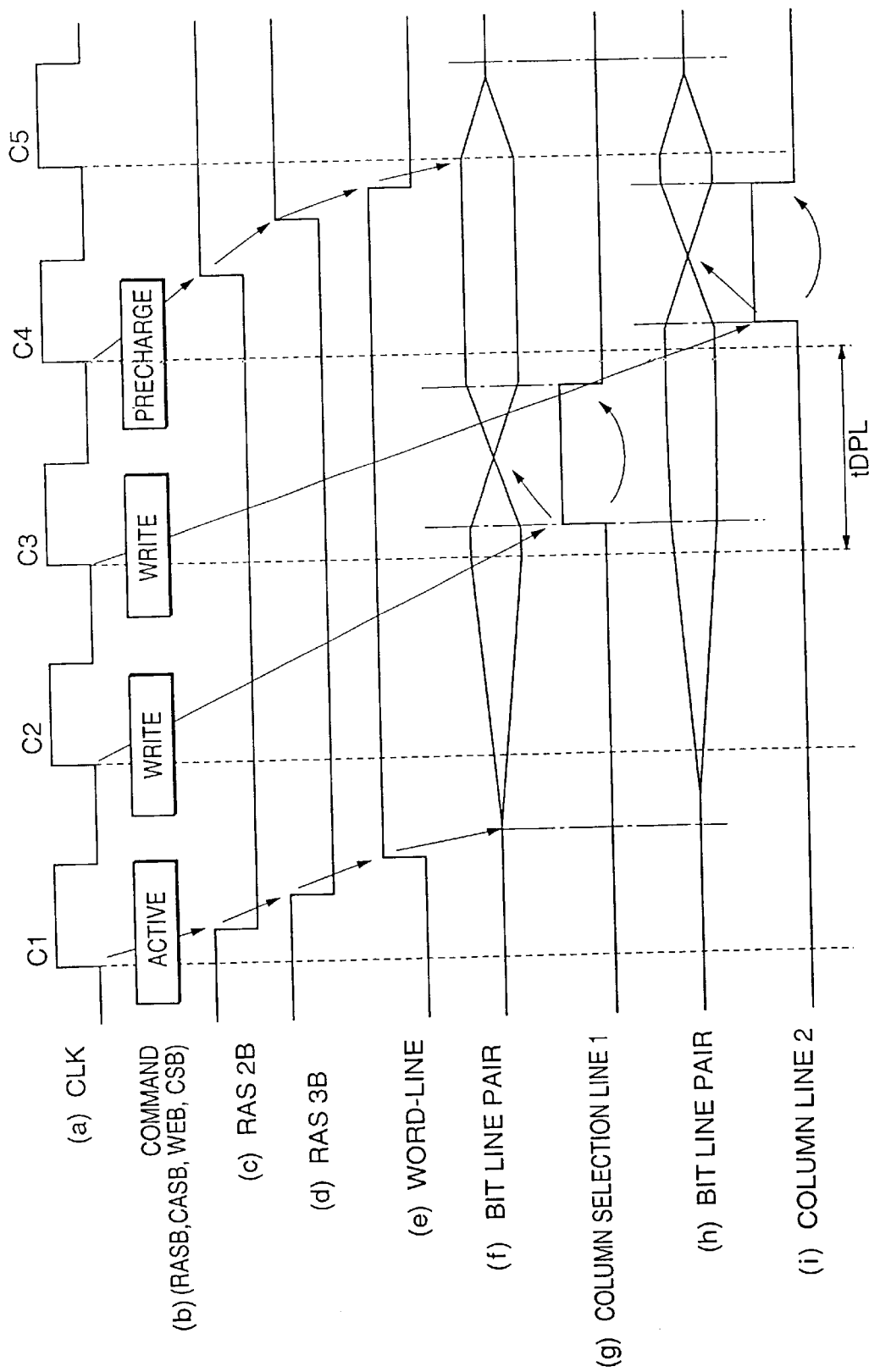
FIG. 7 is a timing chart showing the operation of the conventional device in FIG. 5.
Figure 8:
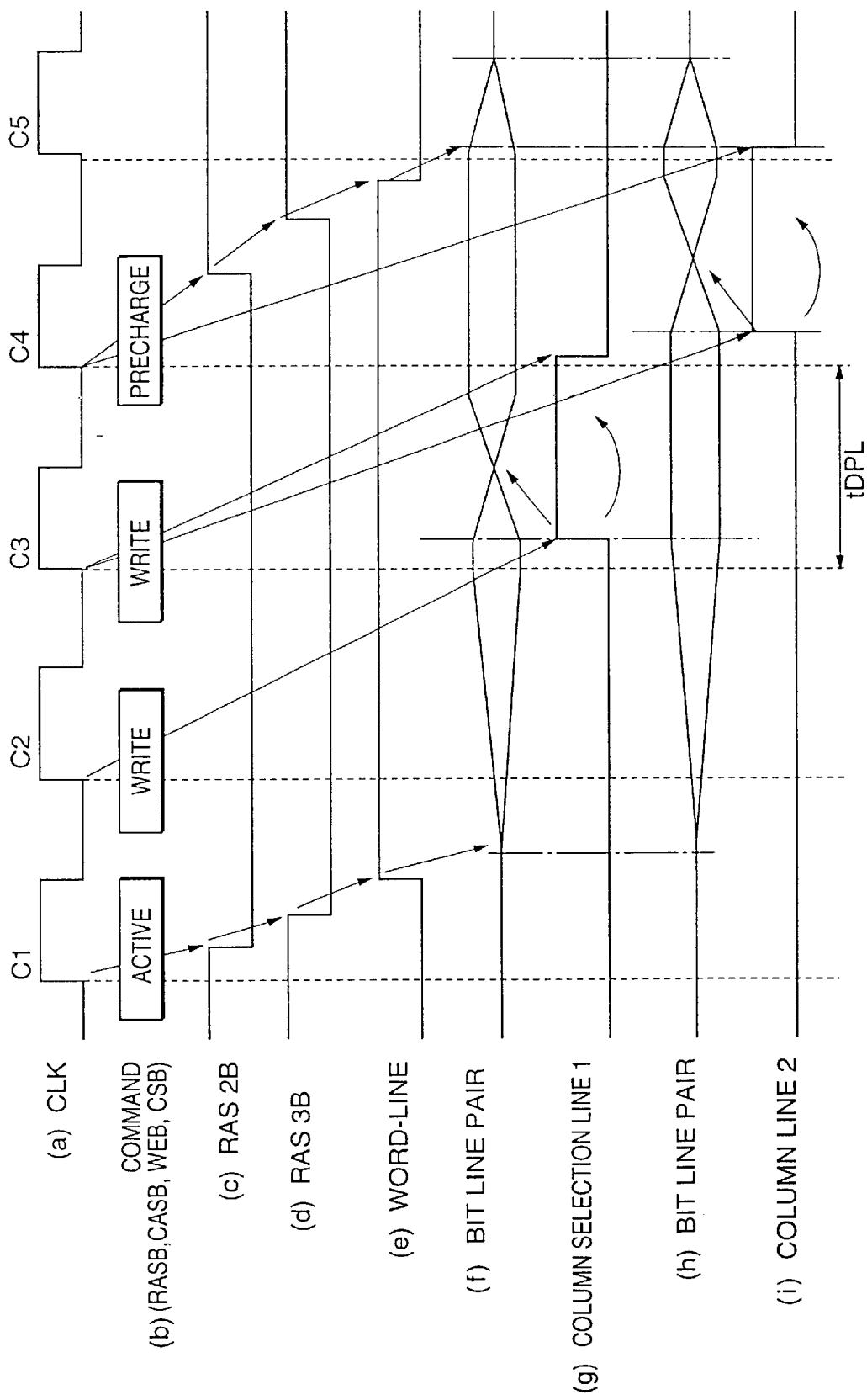
FIG. 8 is another example of the timing chart showing the operation of the conventional device.

Next, referring to the timing chart shown in FIG. 3, the operation of the present invention will be described. Here, since the operations from cycle C1 to cycle C3 of the clock in FIG. 3 are the same as the corresponding operations in the conventional device (FIG. 7), description about the operations will be given briefly. FIG. 3(a) is the external clock CLK, and FIG. 3(b) is the command from the command decoder 2. In addition, FIG. 3(j) is the TEST signal output from the test mode decision circuit 12. First, it will be assumed that the operating mode has been set to the test mode before cycle C1.

With this arrangement, the test mode decision circuit 12 outputs a high level TEST signal to the row system control signal generating circuit 5 as shown in FIG. 3(j).

Here, the test mode is an operating mode by which a semiconductor memory device is subjected to a test prior to its shipping for detecting a defective sense amplifier, a defective memory cell, and the like. In contrast, the normal mode is an operating mode in which the user actually makes use of the semiconductor memory device. The test mode decision circuit 12 decides the operating mode based on the data from the command decoder 2 and the internal address generating circuit 3 as mentioned above. The following description will be given on the assumption that the operating mode is decided to be a test mode. Besides, the test mode decision circuit 12 outputs in the normal mode a TEST signal which is at the low level.

Now, if it is assumed that the command is an active command at the rise of cycle C1 of the clock CLK as shown in FIG. 3(a), the signal RAS2B from the command decoder 2 falls to the low level as shown in FIG. 3(c), and subsequently to that the signal RAS3B from the row system control signal generating circuit 5 falls to the low level as shown in FIG. 3(d). In response to this, a word line corresponding to the address that was input from the internal address generating circuit 3 at the timing of the active command of the clock is selected (at the high level) as shown in FIG. 3(e).

With the selection of the word line, data in the memory cell connected to the word line are read to the sense amplifier circuit 8 through a bit line pair (FIG. 3(f)), and are amplified by the sense amplifier circuit 8. Then, if it is assumed that the command is a write command at the rise of cycle C2 of the clock, a column selection line 1 corresponding to the address input then is selected at the high level for a prescribed duration (FIG. 3(g)). Moreover, data input to the DQ terminal at the input of the write command is written to a sense amplifier selected by the column selection line 1 in the sense amplifier circuit 8, and at the same time, the written data are written through the bit line pair to a memory cell that has been selected by the word line.

Next, if the command is a write command at the rise of cycle C3 of the clock, a column selection line 2 corresponding to the address input at this time is selected at high level for a prescribed duration (FIG. 3(i)) similar to the above. Moreover, data input to the DQ terminal at the time of input of the write command are written to a sense amplifier selected by the column selection line 2 in the sense amplifier circuit 8, and at the same time, the written data are written through the bit line pair to a memory cell that has been selected by the word line as shown in FIG. 3(h).

Next, if it is a precharge command at the rise of cycle C4 of the clock, the signal RAS2B from the command decoder 2 rises to the high level as shown in FIG. 3(c). In synchronism with this, the signal RAS3B from the row system control signal generating circuit 5 rises to the high level as shown in FIG. 3(d), and in response to this, the word line that has been selected falls to the low level as shown in FIG. 3(e) and goes to the unselected state.

Here, since in the test mode in this embodiment a high level TEST signal (FIG. 3(j)) is input to the inverter circuit 12d in FIG. 2, the delay time of the delay circuit 12a is invalidated. Because of this, the rise of the signal RAS3B is hastened, and in response to this the timing for bringing the word line to the unselected state (at the low level) is caused to take place sooner. In other words, as shown in FIGS. 3(c) and 3(d), the time from the rise of the signal RAS2B to the rise of the signal RAS3B is made short, so that the write time to the memory cell can be shortened without substantially changing the write recovery time tDPL.

Since in the test mode of this embodiment the write time can be shortened without changing the write recovery time tDPL, it is possible to easily detect a defective sense amplifier or a defective memory cell that is generated due to the shortening of tDPL without changing tCK.

In this embodiment, since there is obtained an effect that is the same as accelerating tDPL in the direction of its decrease even if tDPL is not actually shortened, there is no need for shortening tCK. Accordingly, it is possible to avoid inability to operate the other circuits that is caused by an excessive shortening of tCK.

Moreover, according to this embodiment, it is possible to detect defective memory cell and the like by using a short test pattern even if the defects can only be detected by the use of a very complicated test pattern that requires a long test time.

Furthermore, since tDPL need not be changed, a screening test can be conducted using a low frequency tester in which the frequency change is not available.

Figure 4:
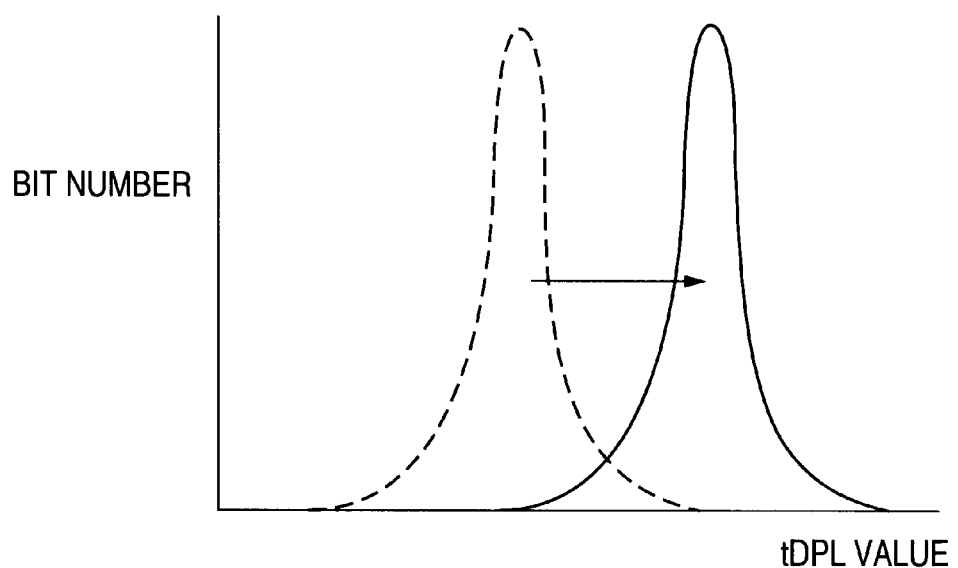
FIG. 4 is a diagram showing the distribution of defective bits as a function of the value of tDPL.

FIG. 4 shows a comparison of the defective bit distribution generated by the shortening of tDPL between the conventional device and the present embodiment. The abscissa is the tDPL value and the ordinate is the defective bit number. The broken curve and the solid curve are the distributions in the test mode for the conventional device and this embodiment, respectively. As is clear from FIG. 4, the general trend is that the distribution of defective bit is shifting toward larger value of tDPL.

As described in the above, according to this invention, it is possible to readily detect a defective sense amplifier and a defective memory cell that are generated due to shortening of the write recovery time tDPL, without actually changing tDPL, by setting the timing for putting the word line to the unselected state to occur sooner in the test mode than in the normal mode.

Although the invention has been described with reference to a specific embodiment, this invention is not meant to be construed in a limiting sense. Various modifications of the disclosed embodiment will become apparent to persons skilled in the art upon reference to the description of the invention. It is therefore contemplated that the appended claims will cover any modifications or embodiments as fall within the true scope of the invention.

What is claimed is:

1. A semiconductor memory device comprising:
   a memory cell array having a plurality of bit lines and a plurality of word lines installed perpendicular to said plurality of bit lines and a plurality of memory cells disposed at the intersections of the bit lines and the word lines, a row decoder which selects a prescribed word line out of said plurality of word lines in response to a row address when a control signal is in an activated state and brings all the word lines to an unselected state when said control signal goes to an inactivated state, a test mode decision circuit which decides that the device is in a test mode and generates a test signal, and a control signal generating circuit which brings said control signal to the activated state and keeps it there for a prescribed duration in response to an instruction signal, wherein said control signal generating circuit is provided with a means for changing said control signal to the inactivated state in response to the occurrence of the test signal sooner than in a normal operation.

2. The semiconductor memory device as claimed in claim 1, wherein said control signal generating circuit is equipped with a means which selects either one of outputting said instruction signal as it is or outputting it by delaying for a prescribed duration, in response to the supply of said test signal.

3. The semiconductor memory device as claimed in claim 2 including a delay circuit which delays said instruction signal by a prescribed time, a first logic gate having the delayed signal output from said delay circuit and said test signal as the inputs and a second logic gate having the output of said first logic gate and said instruction signal as the inputs.

4. The semiconductor memory device as claimed in claim 2, wherein said instruction signal is a row address strobe signal.

* * * * *